United States Patent [19]

Eisele et al.

[11] Patent Number: 4,543,467

[45] Date of Patent: Sep. 24, 1985

[54] EFFUSION TYPE EVAPORATOR CELL FOR VACUUM EVAPORATORS

[75] Inventors: Ignaz Eisele, Icking; Bernhard Bullemer; Andreas Beck, both of Munich, all of Fed. Rep. of Germany

[73] Assignee: Balzers Aktiengesellschaft, Liechtenstein

[21] Appl. No.: 545,235

[22] Filed: Oct. 25, 1983

[30] Foreign Application Priority Data

Oct. 26, 1982 [CH] Switzerland .................. 6224/82

[51] Int. Cl.$^4$ ............................................ F27B 14/12
[52] U.S. Cl. .................................. 219/271; 219/276; 118/726; 432/263
[58] Field of Search .......................... 219/271–276; 118/726, 727, 50.1; 432/262, 263; 427/49, 50, 51, 52

[56] References Cited

U.S. PATENT DOCUMENTS

| | | | |
|---|---|---|---|
| 1,147,775 | 7/1915 | Zarella | 219/271 |
| 1,990,338 | 2/1935 | Lippert | 219/271 |
| 3,105,894 | 10/1963 | Matz | 219/275 |
| 3,971,334 | 7/1976 | Pundsack | 118/5 |
| 4,010,349 | 3/1977 | Lee | 219/272 |
| 4,061,800 | 12/1977 | Anderson | 219/271 |
| 4,328,763 | 5/1982 | Sommerkamp | 219/271 |

FOREIGN PATENT DOCUMENTS

| | | |
|---|---|---|
| 747257 | 9/1944 | Fed. Rep. of Germany . |
| 1451345 | 9/1966 | France . |
| 151476 | 10/1981 | German Democratic Rep. . |

OTHER PUBLICATIONS

Shen, L. Y. L., "Angular Distribution of Molecular Beams . . . ", Jour. of Vac. Sci. and Tech., vol. 15, (1978), pp. 10–12.
Collins, D. M., "On the Use of Downward-Looking Sources", Jour. of Vac. Sci. and Tech., vol. 20, (1982), pp. 250–251.
Kubiak, R. A., "A Simple Source Cell Design for MBE", Jour. of Vac. Sci. and Tech., vol. 20, (1982), pp. 252–253.
Motzfeldt, K., "The Thermal Decomposition of Sodium Carbonate", *J. Phys. Chem.*, vol. 59, Feb. 1955, pp. 139–147.
Farrow, R. F. C., "A High Temperature High Purity Source", *Thin Solid Films*, vol. 53, 1978, pp. 303–315.
Vacuum Generators, "Data Sheet: VG MBE Source Assembly", 9/2/78.
Künzel, H., "The Effect of Arsenic Vapor . . . ", Appl. Phys. A, vol. 28, (1982), pp. 167–173.

*Primary Examiner*—Roy N. Envall, Jr.
*Assistant Examiner*—Teresa J. Walberg
*Attorney, Agent, or Firm*—McGlew and Tuttle

[57] ABSTRACT

Vapor sources for vacuum evaporators in which the evaporation rate has hitherto been adjusted by varying the temperature of the vessel containing the evaporative substances, have a very large time constant, and an approximately exponential control characteristic. The invention substantially reduces the time constant in an effusion evaporator cell by providing that the rate is adjusted by means of a mechanical slide, preferably of boron nitride or graphite, placed in front of the vapor escape aperture or apertures of the evaporator vessel.

7 Claims, 4 Drawing Figures

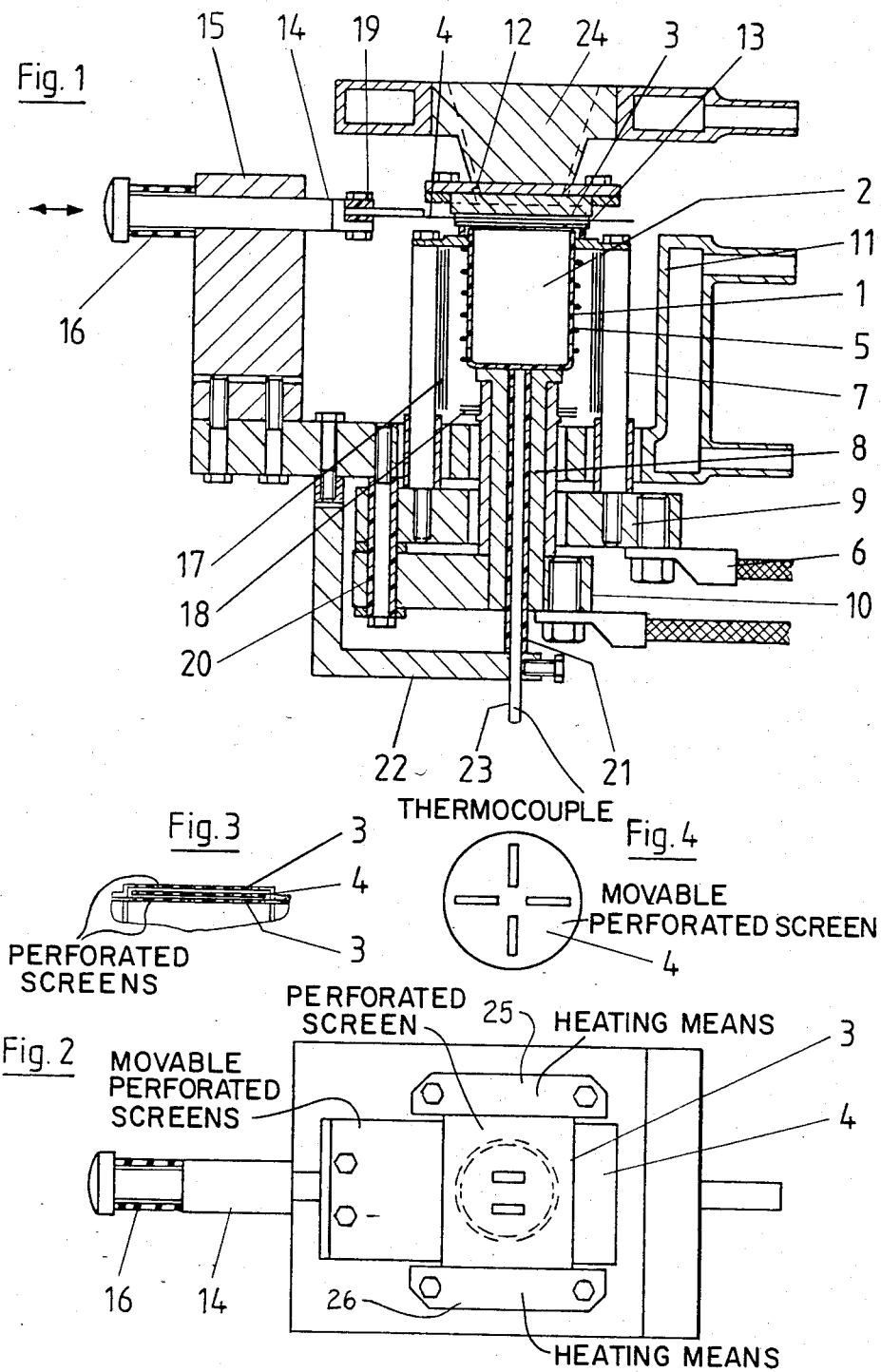

EFFUSION TYPE EVAPORATOR CELL FOR VACUUM EVAPORATORS

FIELD AND BACKGROUND OF THE INVENTION

The invention relates, in general, to vacuum evaporators and, in particular, to a new and useful effusion-type evaporator cell utilizing a mechanical slide for controlling a vapor escape evaporator to adjust the vapor effusion rate quickly and accurately.

Vapor sources are known which are equipped with a so-called total shutter, i.e. with movable screens which are arranged over the opening of the vapor source and with which the vapor source can be opened or shut rather abruptly. Before this, so-called vaporization dishes were employed almost exclusively. What was appreciated in such vaporization dishes was the large surface area which permitted large vaporization rates. Some substances, however, tend to spatter as they are fused in the vaporization dish. The spattered material may be intercepted by one or more covers positioned above the vaporization dish and provided in a suitable manner with aperatures (French Pat. No. 1,451,345). Further known are vapor sources designed as closed vessels and equipped with nozzles having an adjustable orifice (German Pat. No. 742,257).

At a growing rate, vapor sources are being employed which are designed and operate as basically described in the article "The Thermal Decomposition of Sodium Carbonate by the Effusion Method", by K. Motzfeldt in *J. Phys. Chem.*, Volume 59, pages 139 to 147, and the article "A High Temperature High Purity Source for Metal Beam Epitaxy", by R. F. D. Farrow and G. M. Williams in *Thin Solid Films*, Volume 53, (1978), pages 303 to 315.

Features which distinguish evaporative from so-called effusion cells are a small effective evaporative surface and a homogeneous temperature profile of the substance to be vaporized. The crucibles of effusion cells may be provided at their upper rim with covers having a more or less large central hole. In this way, the vapor effusion rate may be preselected. Vapor sources thus modified are known from data sheet No. 10,005,278 by the company Vacuum Generators. By heating the cover having the central hole, the molecular conditions of the evaporating substance may be controlled in addition. This is described in the article "The Effect of Arsenic Vapor Species on Electrical and Optical Properties of Gas Grown by Molecular Beam Epitaxy", by H. Künzel, J. Knecht, H. Jung, K. Wunstel and K. Ploog, in *Appl. Phys. A*, Volume 28 (1982), pages 167 to 173.

It is further known from the article "Angular Distribution of Molecular Bemas from Modified Kundsen Cells for Molecular-Beam Epitaxy", by L. Y. L. Shen in *Journal of Vacuum Science and Technology*, Volume 15 (1978), pages 10 to 12, that the geometric distribution of the vapor beam can be controlled by means of crucible covers which are provided with a plurality of parallel bores.

By "effusion cells" within the context of this specification, evaporator cells are understood which are designed as closed vessels and have a vapor outlet whose size does not substantially affect the thermal equilibrium of the cell.

In molecular beam epitaxy (MBE) applications, a special effusion cell geometry has proved advisable which is described in the articles "On the Use of 'Downwardlooking' Sources in MBE Systems", by D. M. Collins in *Journal of Vacuum Science and Technology*", Volume 20 (1982), pages 250 to 251, and "A Simple Source Cell Design for MBE", by R. A. Kubiak, P. Driscoll and E. H. C. Parke in *Journal of Vacuum Science and Technology,* Volume 20, (1982), pages 252 to 353.

In vapor sources of the vacuum deposition technique, it should be possible to adjust the vapor effusion rate to a value corresponding to the requirements of the coating process just to be, or being performed, and to keep it constant at that level. However, such an adjustment of the vapor effusion rate by adjusting the wattage supplied to the evaporated requires time constants of ten to sixty seconds.

Because of this thermal inertia of the evaporator, thermal fluctuations due to variations of the heating power and of ambient conditions (such as coolant circulation), cannot be compensated for quickly enough and, consequently, the vapor effusion rate cannot be kept constant with a satisfactory accuracy.

The drawback of the thermal inertia is disturbing especially in coating processes where substance mixtures are deposited, and the individual components of the mixture are evaporated from two or more evaporator cells. If, in addition, the composition of the layer is to be varied in the direction perpendicular to the surface, in accordance with a program, for example to produce so-called diffusion profiles of heterojunctions in semiconductor technology, the mixing ratio cannot be varied quickly enough.

It is true, as mentioned above, that arrangements permitting the adjustment of the orifice and then the vapor effusion from a nozzle mechanically, by means of a slide, have already been provided. Unfortunately, experience has shown that simple slides easily become sticky by the condensed evaporated substance, and thus lock. Furthermore, especially with small vapor holes, the problem arises that, due to condensate deposits on the edges of the slide, the aperture varies in an unpredictable way, which strongly affects the desired control characteristics.

SUMMARY OF THE INVENTION

The present invention is directed to a novel vapor source for evaporators with an adjustable vapor effusion rate, having a shorter time constant and a better control characteristic and thus being quicker in response and useable in automatic coating apparatus with equipment for computer-controlled evaporation. Another objective of the invention is to indicate structural materials which proved particularly suitable for an effusion cell of an evaporator.

Accordingly, an object of the present invention is to provide an effusion evaporator cell for vacuum evaporators which is designed as a substantially closed, heatable vessel for the evaporative substance, including a wall portion having at least one aperture for letting vapor effuse therethrough, the wall portion being associated with a heatable slide for adjusting the vapor effusion rate.

A further object of the invention is to provide such a cell wherein the slide is also provided with apertures and is designed as a setting member for controlling the vapor effusion rate, the control characteristic for the vapor change being determined by the shape of the apertures.

The invention starts from the following considerations: In an evaporator effusion cell, the particle flow F at a distance r from the center of the cell aperture is given by the formula:

$$F = \frac{P(T) \cdot A}{\pi r^2 \sqrt{2\pi mkT}} \left[\frac{\text{particles}}{\text{cm}^2 s}\right]$$

with P (T) being the saturation vapor pressure over the substance to be evaporated, A the area of the outlet aperture, m the particle mass, and T the temperature of the substance to be evaporated. From the Clausius-Clapeyron-equation, P(T) may be determined by suitable approximation as:

$$P(T) = P_o \cdot e^{\frac{-\Delta H}{R \cdot T}}$$

wherein $P_o$ is a constant, $\Delta H$ the enthalpy of evaporation, and R the gas constant.

In the prior art thermal method of controlling the vapor effusion rate, A is constant and particle flow F is controlled through the temperature T in accordance with:

$$F = C \cdot \frac{e^{-\frac{a}{T}}}{\sqrt{T}}$$

where $$C = \frac{P_o \cdot A}{\pi r^2 \cdot \sqrt{2\pi mk}} \quad a = \frac{\Delta H}{R}$$

By keeping temperature T constant and varying outlet area A, a substantially simpler relation of $$F = D \cdot A \text{ wherein } D = \frac{P(T)}{\pi r^2 \sqrt{2m\pi kT}}$$

is obtained.

By selecting a suitable shape of outlet area A, any desired control characteristic can be obtained, e.g. with a slot-like shape there is a linear relation between F and A so that F is proportional to the displacement. The inertia of the control response is determined only by the time constant of the slide motion alone (typically <1 sec). A combination of a slide control with a temperature control of the effusion rate is possible, of course. Surprisingly, a control of the vapor effusion rate by means of a movable slide has proved practicable. A reproducible adjustment of this rate is feasible even at the high temperatures of evaporation, which frequently exceed 1000° C. The expected risks were an uncontrollable warping of the system of screens, which might unpredictably change the control characteristic. Also, as mentioned, a sticking of the movable part of the screen system to the fixed part appeared probable. Furthermore, there was a risk that the vapor source will not be satisfactorily tightly shut off by a slide. According to the invention, these problems have sufficiently been overcome.

A further object of the invention is to provide an effusion evaporator cell for vacuum evaporators which is simple in design, rugged in construction and economical to manufacture.

For an understanding of the principles of the invention, reference is made to the following description of typical embodiments thereof as illustrated in the accompanying drawings.

BRIEF DESCRIPTION OF THE DRAWINGS

In the Drawings:

In the following, embodiments of the invention are described in more detail with reference to the drawings in which:

FIG. 1 is a vertical sectional view of the device;

FIG. 2 is a top plan view corresponding to FIG. 1, with the coolable housing omitted;

FIG. 3 shows the slide and the wall portion in a multi-part design; and

FIG. 4 shows a rotary slide with radial slots.

DESCRIPTION OF THE PREFERRED EMBODIMENTS

Referring to the drawings, and for ease of understanding, the elements of the invention are designated as follows:

1—an evaporation crucible, made of an oxide or nitride, for example;
2—the evaporative substance received in the crucible;
3—the perforated screens by which the crucible is shut off so that a substantially closed evaporation vessel is formed;
4—a second, displaceable perforated screen or slide provided therebetween and having corresponding apertures for the passage of vapor;
5—a coil for electrically heating crucible 1;
6—terminals for supplying current to heating coil 5;
7 and 8—conductors for supplying heating coil 5;
9 and 10—supports for connectors 7 and 8;
11—an outer housing coolable by a fluid flowing therethrough;
12—holders of the fixed perforated screens, serving at the same time as conductors for supplying current to the two ends of the screens;
14—an insulator, for example made of the same material as the evaporation crucible, on which perforated screens 3 rest;
14—a slide member to which displaceable screen 4 is secured;
15—a plain bearing permitting the sliding displacement of screen 4;
16—a compression spring to eliminate inaccuracies in the adjustment of screen 4;
17—cylindrical radiation screens, of molybdenum or tantalum, for example;
18—disc-shaped radiation screen;
19—insulators provided between slide 14 and movable screen 4;
20—insulators provided between supports 9 and 10 and housing 11;
21—an insulator having an axial bore for introducing a thermocouple;
22—a support for a thermocouple;
23—the thermocouple;
24—a housing provided with a funnel-shaped insert and coolable by a fluid flowing therethrough; and
25 and 26—are heating means for the screen 3.

In operation, the crucible is heated by coil 5 and kept at a temperature sufficient for evaporation (1200° C. for vaporizing aluminum). In the substantially closed vessel formed by the crucible and the multipart wall system of screens 3, the substance 2 to be evaporated, and received in crucible 1, produces a vapor pressure corresponding to the temperature of the melt. The vapor passes through the apertures in the two fixed perforated screens 3 and in the displaceable screen or slide 4 provided therebetween, and effuses therethrough in an amount proportional to the passage area resulting from the mutual position of the perforated screens. By displacing the intermediate perforated screen 4, forming the slide according to the invention, the outlet apertures may become either entirely closed or entirely opened, or adjusted in any position therebetween. FIG. 3 shows in detail how the heatable wall portion (perforated screens 3) and the slide (perforated screen 4) are mutually arranged. The displaceable slide member 14, connected to a suitable actuating member passed vacuum-tightly through the housing 11 on bearing 15, may be moved by hand, or mechanically, in an automatic arrangement (servo motor, stepping motor, etc.). The vapor effusion rate may be adjusted in accordance with a program, and the mechanism may be included in a closed control loop.

FIG. 2 shows how the heating of the slide may be effected, namely in the most simple design, by supplying heating current to the two fixed perforated screens at two opposite sides 25, 26. By controlling the amperage, the temperature of the system of screens can be adjusted to a value suitable for the period of evaporation. By adjusting the slide temperature relative to the temperature of the heated evaporation crucible 1, even the spatial distribution of the effusing vapor can be controlled.

It will be understood by anyone skilled in the art that a control of the effusion rate is practical not only with designs of perforated wall portions as shown, but also with any modifications thereof. For example, the perforated wall portion itself may also be designed as a movable member, i.e. a slide. Further, instead of a slide with a purely translational displacement, a rotary slide may be provided having radially extending apertures, such as shown at 4 in FIG. 4. The vapor effusion rate is always varied by varying the total passage area formed by the mutual position of the apertures in the slide and in the wall portion.

The inventive adjustment of the effusion rate by means of a mechanical slide is advantageous particularly in connection with control equipment, since time constants of fractions of a second can easily be achieved, while in a prior art adjustment through the temperature of the evaporator, the thermal inertia of the latter requires time constants of 10 seconds or more. In connection with suitable devices for measuring the rate, such as a mass spectrometer, a heated vapor source can be obtained having a vapor effusion rate of a steadiness never attained before.

In a development of the invention, it is provided that the mentioned portions of the wall and the slide are made of boron nitride, or graphite. That is, experience has shown that, as compared to other materials, on these materials the formation of surface nucleuses for a following condensation is extremely small so that no condensation takes place even at temperatures which are much lower than the vaporization temperature. This has the advantage that frequently any separate additional heating of the wall portions and the slide can be omitted, since the temperature dissipation from the crucible is sufficient.

While specific embodiments of the invention have been shown and described in detail to illustrate the application of the principles of the invention, it will be understood that the invention my be embodied otherwise without departing from such principles.

What is claimed is:

1. An effusion evaporator cell for a vacuum evaporator, comprising:
    a housing:
    a crucible defining a space for containing material to be evaporated connected to said housing;
    crucible heating means associated with said crucible for heating said crucible to evaporate material in said crucible to form a vapor;
    a wall portion connected to said crucible for closing said space, said wall portion having at least one aperture therein for allowing vapor to effuse therethrough and out of said crucible;
    a heatable slide slidably mounted to said housing and across said wall portion for varying an opening of said at least one aperture of said wall portion for adjusting the amount of vapor effused out of said crucible;
    slide heating means associated with said slide for heating said slide;
    said slide being made of one of boron nitride and graphite, and said wall portion being made of one of boron nitride and graphite.

2. An effusion evaporator cell for a vacuum evaporator, comprising:
    a housing;
    a crucible defining a space for containing material to be evaporated connected to said housing;
    crucible heating means associated with said crucible for heating said crucible to evaporate material in said crucible to form a vapor;
    a wall portion connected to said crucible for closing said space, said wall portion having at least one aperture therein for allowing vapor to effuse therethrough and out of said crucible;
    a heating slide slidably mounted to said housing and across said wall portion for varying an opening of said at least one aperture of said wall portion for adjusting the amount of vapor effused out of said crucible;
    said slide including at least one aperture corresponding to said at least one aperture of said wall portion and movable with respect thereto;
    said slide including at least one aperture corresponding to at least one aperture of said wall portion and movable with respect to said at least one aperture of said wall portion;
    slide heating means comprises means connected to said wall portion for heating said wall portion, said slide being heated by heat from said wall portion; and
    an additional wall portion spaced from and extending parallel to said first-mentioned wall portion, said additional wall portion having at least one aperture aligned with said aperture of said first-mentioned wall portion, said slide mounted for sliding between said first-mentioned and additional wall portions.

3. A cell according to claim 2, wherein said slide is made of one of boron nitride and graphite.

4. An effusion evaporator cell for a vacuum evaporator comprising:
    a housing:

a crucible defining a space for containing material to be evaporated connected to said housing;

crucible heating means associated with said crucible for heating said crucible to evaporate material in said crucible to form a vapor;

a wall portion connected to said crucible for closing said space, said wall portion having at least one aperture therein for allowing vapor to effuse therethrough and out of said crucible;

a heatable slide slidably mounted to said housing and across said wall portion for varying an opening of said at least one aperture of said wall portion for adjusting the amount of vapor effused out of said crucible;

slide heating means associated with said slide for heating said slide;

a slide bearing connected to said housing, a slide member slidably mounted in said bearing, said slide connected to said slide member; and biasing means connected to said slide member for biasing said slide in a selected direction, said slide member including an actuator portion for controlling the opening of said at least one aperture of said wall portion;

said crucible heating means comprises a coil wrapped around said crucible and a pair of contacts mounted on said housing and connected to said coil, said slide heating means comprising a pair of heating members connected on opposite sides of said wall portion for heating said wall portion, said slide being heated by heat from said wall portion.

5. A cell according to claim 4, including a second wall portion spaced from and extending parallel to said first-mentioned wall portion, said second wall portion having at least one aperture therein aligned with said aperture of said first-mentioned wall portion, said slide slidably mounted for movement between said said first-mentioned and second wall portions.

6. A cell according to claim 4, wherein said slide is circular and includes at least one aperture corresponding to said aperture of said wall portion, said slide being rotatably mounted for movement with respect to said wall portion.

7. A cell according to claim 4, wherein said slide and said first-mentioned wall portion are both made of one of boron nitride and graphite.

* * * * *